US005517109A

United States Patent [19]
Albean et al.

[11] Patent Number: 5,517,109
[45] Date of Patent: May 14, 1996

[54] APPARATUS WITHIN AN INTEGRATED CIRCUIT FOR AUTOMATICALLY DETECTING A TEST MODE OF OPERATION OF THE INTEGRATED CIRCUIT AND SELECTING A TEST CLOCK SIGNAL

[75] Inventors: David L. Albean; John W. Gyurek, both of Indianapolis; Christopher D. Duncan, Greenfield, all of Ind.

[73] Assignee: Thomson Consumer Electronics, Inc., Indianapolis, Ind.

[21] Appl. No.: 378,765

[22] Filed: Jan. 26, 1995

Related U.S. Application Data

[63] Continuation of Ser. No. 971,183, Nov. 3, 1992, abandoned.

[51] Int. Cl.⁶ .................................................. G04F 9/00
[52] U.S. Cl. .................. 324/158.1; 371/61; 327/292; 327/298
[58] Field of Search ................ 324/73 R, 181, 324/61, 63, 158.1, 187, 188; 328/63, 61; 307/219, 269, 271

[56] References Cited

U.S. PATENT DOCUMENTS 3,675,127  7/1972  Mekiernan ............................ 324/186
4,272,777  6/1981  Fitzgerald ............................... 358/10
4,293,870  10/1981  Steckler et al. ......................... 358/10
4,365,203  12/1982  DiMassimo et al. .................... 328/63
4,724,380  2/1988  Burrows et al. ..................... 324/73 R
4,800,564  1/1989  DeFazio et al. ......................... 371/61
5,065,042  11/1991  Thomsen et al. ...................... 307/269
5,066,868  11/1991  Doty et al. ............................. 307/262
5,079,623  1/1992  Sendelweck et al. .................... 358/74

FOREIGN PATENT DOCUMENTS 04282913  10/1992  Japan .

Primary Examiner—Kenneth A. Wieder
Assistant Examiner—Barry C. Bowser
Attorney, Agent, or Firm—Joseph S. Tripoli; Peter M. Emanuel; Robert D. Shedd

[57] ABSTRACT

An integrated circuit (IC) includes circuitry for generating a clock signal during both a normal mode of operation and a test mode of operation. During the normal mode, an input clock signal is delayed via a skew corrector. In test mode, an input test clock signal bypasses the skew corrector via a clock signal source selector. The clock signal source selector is controlled automatically by a mode detector that responds to the input clock signals to determine the mode of operation of the IC.

12 Claims, 3 Drawing Sheets

APPARATUS WITHIN AN INTEGRATED CIRCUIT FOR AUTOMATICALLY DETECTING A TEST MODE OF OPERATION OF THE INTEGRATED CIRCUIT AND SELECTING A TEST CLOCK SIGNAL

This is a continuation of application Ser. No. 07/971,183, filed Nov. 3, 1992, now abandoned.

FIELD OF THE INVENTION

The present invention relates to testing the operation of an integrated circuit.

BACKGROUND OF THE INVENTION

An integrated circuit (IC) may be tested at various stages during the production and use of the IC. For example, tests may be performed following production to verify that the IC exhibits functional and parametric characteristics that conform to the specification for the IC. IC testing typically involves programmable automatic test equipment (ATE) that includes a plurality of signal generation channels for generating test signals that are applied to the input and output (IO) pins of the IC. The ATE evaluates the response of the IC to the test signals.

Typical tests performed on a digital IC include timing tests such as determining the setup and hold time of a data signal with respect to a clock signal. Timing tests may be performed by programming an ATE to vary the delay between a data signal and a clock signal. The delay values that cause the IC to operate correctly are determined and compared to the specifications for the IC.

Tests such as the described timing tests may be adversely affected by internal features of the IC. For example, an IC may include an internal skew corrector (or variable phase shifter) that adjusts the delay of one signal, e.g. a clock signal, with respect to another signal, e.g. a data signal. An example of this type of variable phase shifter is described in U.S. Pat. No. 5,066,868 entitled APPARATUS FOR GENERATING PHASE SHIFTED CLOCK SIGNALS that issued to J. H. Doty, II et al. on 19 Nov. 1991. An internal skew corrector such as that disclosed by Doty, II et al. includes analog circuitry. The timing characteristics of analog circuitry may vary significantly as IC fabrication process parameters vary causing the timing of the skew corrector to be different in each IC. It might be necessary, therefore, to adapt the timing of an ATE test program to each IC before actually performing timing tests. Adapting the test program to the characteristics of each chip would lengthen the time required for testing each IC. Increasing the duration of testing is undesirable, particularly during production when large numbers of integrated circuits must be tested.

To facilitate testing, therefore, it may be desirable to bypass an internal feature, such as a skew corrector, during testing. For example, a skew corrector may be bypassed by including a two-to-one multiplexer (2:1 MUX) in the IC. One input of the MUX is coupled to the input of the skew corrector (the uncorrected signal) and the other input of the MUX is coupled to the skew corrector output (the corrected signal). During normal operation (normal mode), the MUX selects the skew corrector output to provide a skew corrected signal. During testing (test mode), the MUX selects the uncorrected signal to eliminate the effects of the skew corrector, thereby bypassing the skew corrector.

For a MUX to provide the desired bypass function during testing, a MUX control signal must be set to an appropriate value. For example, a test program for an ATE may include a portion that activates the bypass function by setting a bit in a control register in the IC that defines the MUX control signal. However, including program steps to control a bypass MUX may undesirably increase the time required for testing preventing the full benefit of a bypass MUX from being realized.

SUMMARY OF THE INVENTION

In accordance with a feature of the invention, an integrated circuit having first and second modes of operation includes an input terminal and means for generating first and second intermediate signals. The first intermediate signal is generated during the first mode in response to a first input signal that is indicative of the first mode. The second intermediate signal is generated during the second mode in response to a second input signal that is indicative of the second mode. One of the first and second intermediate signals is coupled to an output via means responsive to the first and second input signals such that the first intermediate signal is coupled to the output during the first mode, and the second intermediate signal is coupled to the output during the second mode.

BRIEF DESCRIPTION OF THE DRAWING

In FIGS. 1 and 3, the same or similar elements are identified by the same reference numbers.

DETAILED DESCRIPTION OF THE INVENTION

Figure 1:
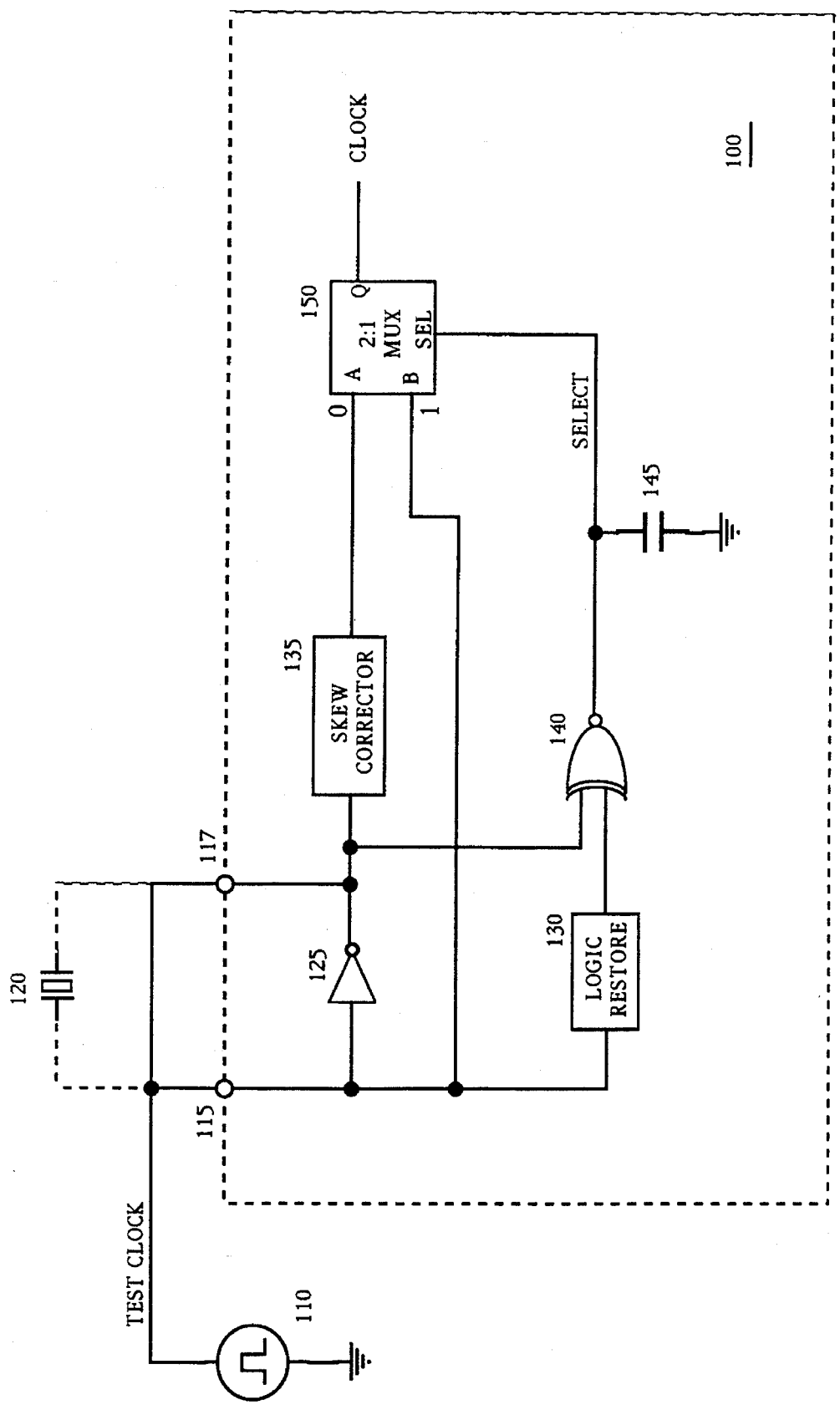
FIGS. 1 and 3 show, partially in schematic form and partially in block diagram form, two embodiments of a portion of an integrated circuit including features in accordance with the invention.

In FIG. 1, digital integrated circuit (IC) 100 includes circuitry for generating a clock signal CLOCK comprising features 125–150. Signal CLOCK may be coupled to various functions (not shown in FIG. 1) within IC 100 to provide, for example, a "master" clock signal that serves as a timing reference signal to control the timing of operations within IC 100. During normal operation (normal mode) of IC 100, signal CLOCK is generated by a crystal controlled oscillator comprising crystal 120 external to IC 100 and inverting amplifier 125 internal to IC 100. Crystal 120 is coupled to terminals 115 and 117 of IC 100. Inverting amplifier 125 has an input coupled to terminal 115 and an output coupled to terminal 117. The combination of crystal 120 and inverter 125 produces a relatively stable clock signal, or timing reference waveform, at terminal 115 during normal mode. Inverter 125 produces an inverted version of the terminal 115 waveform at terminal 117.

A skew corrector 135, having an input coupled to the output of inverting amplifier 125, is included to provide a variable delay in the clock signal path. The variable delay permits adjusting the timing of signal CLOCK with respect to other signals in IC 100 during normal mode. If skew corrector 135 is implemented according to above-mentioned U.S. Pat. No. 5,066,858 (Dory, II et al.), a reference signal (e.g. a data signal or other clock signal) is input to skew corrector 135 to serve as a reference for adjusting the timing of signal CLOCK. Alternatively, a particular delay could be selected in response to a control signal input to skew corrector 100. The control aspect of the variable delay produced by skew corrector 135 is not shown in FIG. 1.

Two-to-one multiplexer (2:1 MUX) 150 permits bypassing skew corrector 135 to provide a version of signal CLOCK during test mode that is not phase shifted by skew corrector 135. An input of MUX 150 (the input designated "A" in FIG. 1) is coupled to the output of skew corrector 135. A second input of MUX 150 (designated "B" in FIG. 1) is coupled to the input of inverter 125. A control signal SELECT coupled to input SEL of MUX 150 determines which one of the intermediate clock signals coupled to the A and B inputs of MUX 150 will be coupled to the output ("Q" in FIG. 1) of MUX 150 to provide signal CLOCK. For example, the arrangement illustrated in FIG. 1 indicates that a logic 0 (e.g. 0 volts) at input SEL of MUX 150 causes the output of skew corrector 135 to be coupled to signal CLOCK. A logic 1 (e.g. 5 volts) at input SEL of MUX 150 couples the signal at terminal 115 to signal CLOCK. Thus, signal CLOCK includes the effects of skew corrector 135 during normal mode and skew corrector 135 is bypassed during test mode.

Control signal SELECT is generated in response to the signals at terminals 115 and 117 of IC 100 by logic restore function 130, exclusive NOR (XNOR) gate 140, and capacitor 145. Logic restore function 130 has an input coupled to terminal 115 and an output coupled to XNOR gate 140. The purpose of logic restore function 130 is to ensure that the signals from terminal 115 provide the logic levels required by XNOR gate 140. During normal mode, for example, the signals at terminal 115 from crystal 120 may exhibit an amplitude that is not sufficient to provide the required logic levels. Logic restore feature 130 may be implemented with a non-inverting buffer amplifier.

Figure 2A:
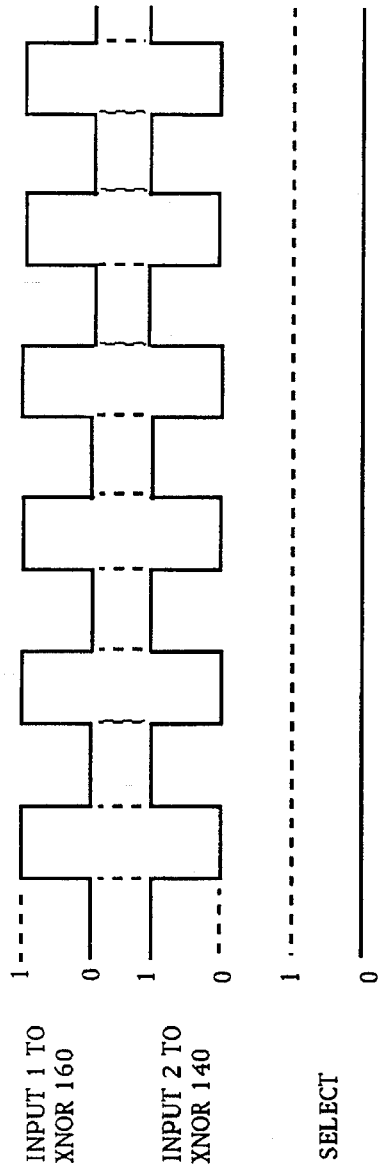
FIGS. 2A and 2B illustrate signal waveforms useful in understanding the operation of the embodiment shown in FIG. 1.

The generation of signal SELECT occurs as follows. During normal mode, the signal at terminal 115 is a periodic pulse waveform. Inverting amplifier 125 causes the signal at terminal 117 to be an inverted version of the signal at terminal 115. Under ideal conditions where inverting amplifier 125 and logic restore function 130 produce no delay, the signals at the inputs of XNOR gate 140 would be unequal at all times as shown in FIG. 2A. As a result, the comparison of the signals from terminals 115 and 117 that occurs in XNOR gate 140 produces a logic 0 on signal SELECT at all times during normal mode. In response, MUX 150 selects the output of skew corrector 135 as the source of signal CLOCK as desired.

During test mode, a test clock signal TEST CLOCK from source 110 is coupled to both terminals 115 and 117. Source 110 may be automatic test equipment (ATE) that permits generating various test waveforms as described above. The output impedance of inverting amplifier 125 at terminal 117 is relatively high to prevent loading of the signal from crystal 120 during normal mode. Thus, it is possible by coupling signal TEST CLOCK to both terminals 115 and 117 to cause the signals at the input and output of inverting amplifier 125 to be substantially equal. Assuming the above mentioned ideal conditions (logic restore function 130 produces no delay) the input signals to XNOR gate 140 are also substantially equal. As a result, signal SELECT at the output of XNOR gate 140 is at logic 1 at all times during test mode causing MUX 150 to couple signal TEST CLOCK to signal CLOCK as desired.

Figure 2B:
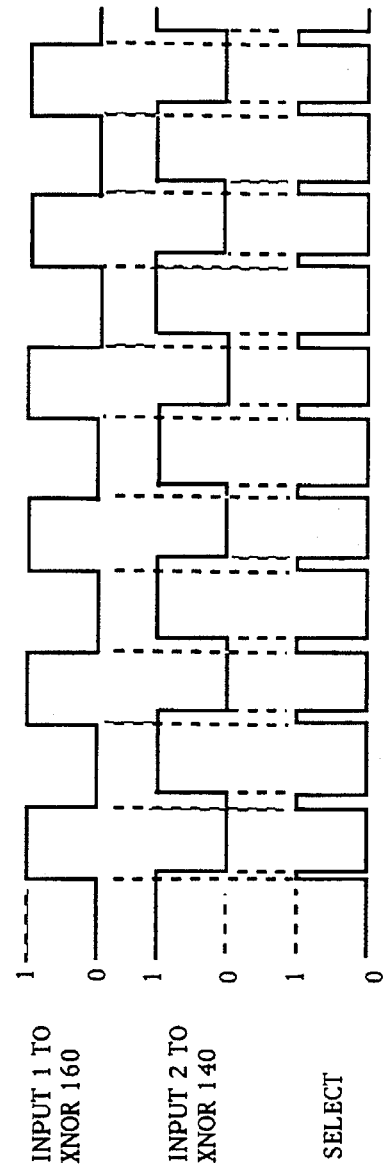

Inverting amplifier 125 and logic restore function 130 are not ideal and do produce delays. In addition, during test mode, terminals 115 and 117 may be coupled to separate channels of automatic test equipment (ATE) rather than connected together as in FIG. 1. Although separate ATE channels typically can be programmed to produce substantially the same waveform, minor differences might exist. The non-ideal delays combined with any ATE anomalies may cause the input signals to XNOR gate 140 to be time shifted with respect to each other as depicted in FIG. 2B. During normal mode, a time shift produces brief intervals during which the input signals to XNOR gate 140 are equal causing narrow pulses to logic 1 to be produced on signal SELECT as shown in FIG. 2B. Similarly, during test mode, the input signals to XNOR gate 140 are unequal for brief intervals producing narrow pulses to logic 0. MUX 150 could respond to these "glitches" during either normal or test modes by momentarily switching the source of signal CLOCK. Undesirable effects (e.g. glitches) may occur in signal CLOCK.

Capacitor 145 is coupled between signal SELECT and ground to serve as a filter that eliminates these undesirable glitches on signal SELECT. The value of capacitor 145 is determined subject to several considerations. First, the duration of the glitches may vary as the delays of inverting amplifier 125 and logic restore function 130 change in response to temperature and IC processing parameter variations. Thus, capacitor 145 must be selected to provide effective filtering for a range of pulse durations. Second, the value of capacitor 145 should be relatively small to minimize the area that is required to integrate capacitor 145 into IC 100. A typical value for capacitor 145 that satisfies these criteria is 5 pF.

The arrangement shown in FIG. 1 detects the mode of operation of IC 100, selects the appropriate source for signal CLOCK, and eliminates undesirable glitches in signal SELECT. These functions are provided automatically without adding steps to an ATE test control program. Thus, the advantage of a skew corrector bypass function is provided without undesirably increasing the time required to test IC 100. Also, the described arrangement does not require additional pins (input/output terminals) of IC 100.

Figure 3:
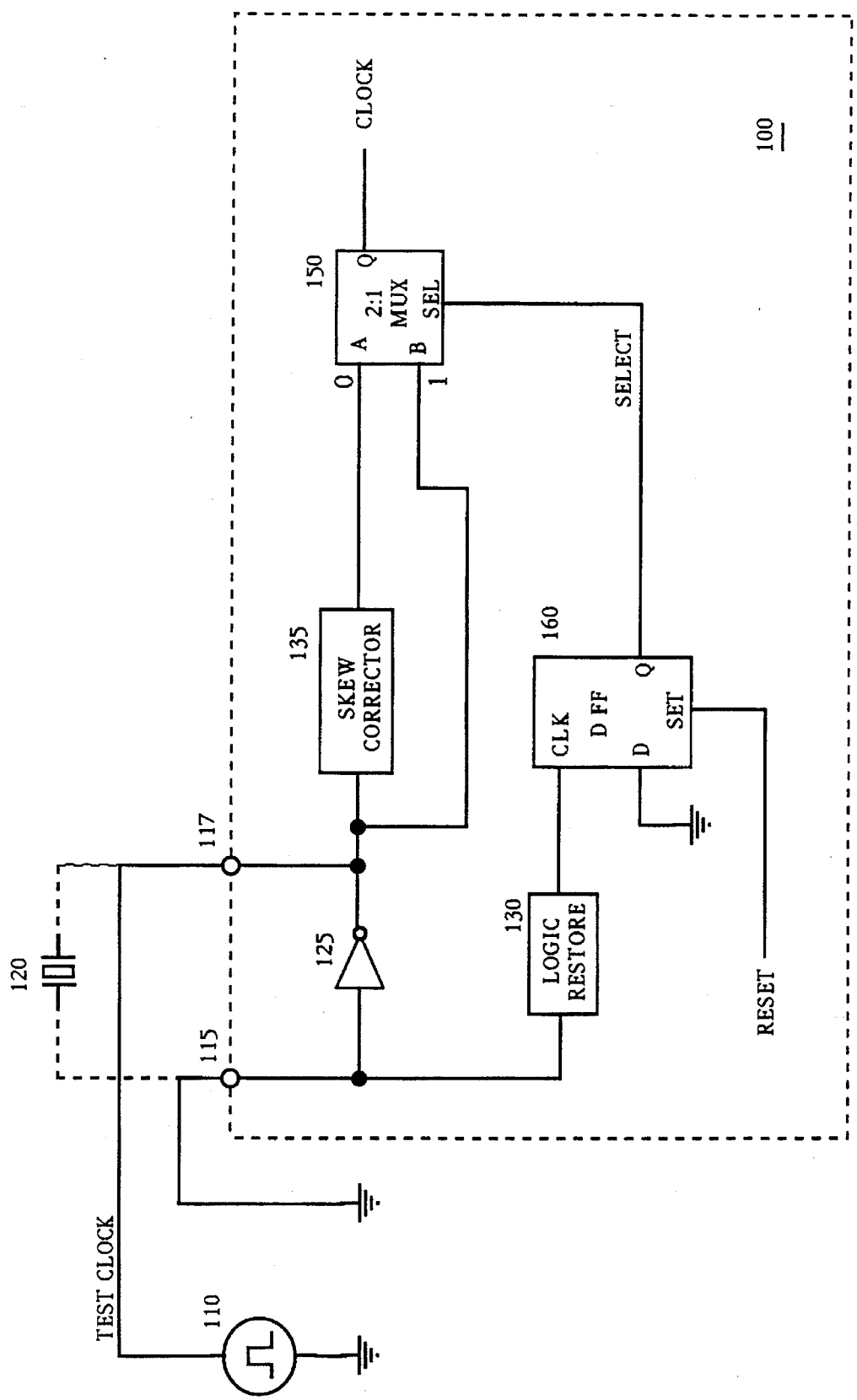

An alternative approach to providing the described automatic selection of signal CLOCK is shown in FIG. 3. The arrangement in FIG. 3 differs from that in FIG. 1 in at least two respects. First, D-type flip flop (DFF) 160 in FIG. 3 replaces XNOR gate 140 and capacitor 145 in FIG. 1. The clock (CLK), data (D), and set (SET) inputs of DFF 160 are coupled to terminal 115 (via logic restore function 130), logic 0 (0 volts), and reset signal RESET, respectively. Signal SELECT, the control signal for MUX 150, is produced at the output (Q) of DFF 160. Second, during test mode in FIG. 3, signal TEST CLOCK is coupled to terminal 117 while terminal 115 is coupled to logic 0 (ground in FIG. 3) rather than having terminals 115 and 117 coupled together as in FIG. 1. Because signal TEST CLOCK is applied only to terminal 117, the "bypass" input of MUX 150 (input "B") is coupled to terminal 117 rather than terminal 115 as in FIG. 1.

Signal RESET is produced by a control circuit that is not shown in FIG. 3. The control circuit may be either external or internal to IC 100. Signal RESET is generated in response to conditions such as "power-up" of IC 100 and causes IC 100 to enter a mode of operation during which, for example, control registers are initialized. In FIG. 3, this initial mode or reset condition is indicated by signal RESET at logic 1. Signal RESET at logic 1 sets the Q output of DFF 160 to logic 1 causing signal SELECT to be at logic 1. Thus, during the initial mode, the B input of MUX 150 is selected bypassing skew corrector 135 and coupling signal CLOCK to terminal 117.

Signal SELECT remains at logic 1 at least until the reset state ends. A clock pulse at the CLK input of DFF 160 after the end of the reset state causes logic 0 at the D input of DFF 160 to be clocked to the Q output of DFF 160. If the reset condition occurs during normal operation of IC 100 when crystal 120 is coupled to terminals 115 and 117, a pulse waveform is being produced continuously at terminal 115 and, therefore, at the CLK input of DFF 160. In normal mode, therefore, signal SELECT will change to logic 0 immediately following the end of the reset state causing signal CLOCK to be coupled to the output of skew corrector 135 as desired. In test mode, terminal 115 is coupled to logic 0 preventing a clock pulse from occurring at the CLK input of DFF 160. Thus, signal SELECT will remain at logic 1 when the reset state ends ensuring that skew corrector 135 is bypassed for the duration of test mode as desired.

The arrangement in FIG. 3 provides automatic selection of the source of signal CLOCK without producing glitches on signal SELECT. Thus, a filter such as capacitor 145 in FIG. 1 is not needed.

Various modifications of the embodiments shown in FIGS. 1 and 3 will be apparent to one skilled in the art. In FIG. 3, for example, signal polarities other than those described may be used. More specifically, a logic 0 on signal RESET may indicate a reset condition rather than a logic 1 as described below. In this case, the SET input of DFF 160 would set signal SELECT to logic 1 when a logic 0 is applied to the SET input (effectively a SETNOT or SETBAR input). Also, if DFF 160 has an inverted output (QNOT) and a reset input, DFF 160 could be connected such that the D input is coupled to logic 1, the reset input is coupled to signal RESET, and the inverted output provides signal SELECT. These and other modifications are intended to be within the scope of the following claims.

We claim:

1. Signal selection apparatus included within an integrated circuit, said apparatus comprising:

a first input terminal of said integrated circuit (IC) for receiving a first input signal comprising a periodic clock signal;

a second input terminal of said IC for receiving a second input signal comprising a phase-shifted representation of said periodic clock signal during a first mode of operation of said IC; said second input signal being subject to a modification during a second mode of operation of said IC;

means responsive to said first and said second input signals for generating first and second signals internal to said IC;

means responsive to a control signal indicating whether said IC is in said first or said second mode of operation for coupling said first signal internal to said IC to a signal path during said first mode of operation and for coupling said second signal internal to said IC to said signal path during said second mode of operation; and means for detecting said modification of said second input signal during a first cycle of said periodic clock signal after said modification occurs and for generating said control signal indicating said second mode of operation during said first cycle of said periodic clock signal.

2. The apparatus of claim 1 wherein said modification of said second input signal during said second mode of operation of said IC comprises changing said phase shift such that said second input signal is substantially the same as said periodic clock signal.

3. The apparatus of claim 2 wherein said phase shift during said first mode of operation is substantially 180 degrees and said phase shift during said second mode of operation is substantially 0 degrees.

4. The apparatus of claim 2 wherein said first and said second input terminals are coupled directly together during said second mode of operation, thereby causing said second input signal to be substantially the same as said periodic clock signal.

5. The apparatus of claim 4 wherein said first signal internal to said IC exhibits a delay with respect to said second signal internal to said IC; and said first signal internal to said IC is generated via a signal path coupled between said second input terminal and an input of said coupling means, said signal path including a skew corrector for generating said delay of said first signal internal to said IC with respect to said second signal internal to said IC.

6. The apparatus of claim 5 wherein said IC includes an inverting amplifier having an input coupled to said first input terminal and an output exhibiting a relatively high output impedance coupled to said second input terminal;

said first and said second input terminals are coupled directly together during said first mode of operation of said IC for producing substantially the same signal at said input and said output of said inverting amplifier, thereby causing said second input signal to be substantially the same as said first input signal; and a crystal is coupled external to said IC between said first and second input terminals during said second mode of operation; said crystal and said inverting amplifier interacting during said second mode of operation for producing at said input of said inverting amplifier a signal inverted with respect to a signal at said output of said inverting amplifier, thereby producing said phase shift between said first and said second input signals.

7. The apparatus of claim 6 wherein said first and said second modes of operation of said IC are respective test and normal modes of operation.

8. The apparatus of claim 7 further comprising a filter coupled to said means for generating a control signal for filtering said control signal.

9. Signal selection apparatus included within an integrated circuit (IC), said apparatus comprising:

a first input terminal of said integrated circuit for receiving a periodic sequence of binary pulses during first and second modes of operation of said IC;

a second input terminal of said IC for receiving a second input signal comprising binary pulses exhibiting a predetermined timing relationship to said binary pulses received at said first input terminal during said first mode of operation and comprising a DC level during said second mode of operation;

means included in said IC and responsive to said binary pulses received at said first input terminal during said first and second modes of operation for generating first and second binary pulse signals;

means responsive to a first control signal for coupling said first binary pulse signal to a signal path in said IC during said first mode of operation, and for coupling said second binary pulse signal to said signal path during said second mode of operation; and means responsive to a second control signal indicating an initial mode of operation of said integrated circuit and to said DC level received at said second input terminal during said second mode of operation for generating said first control signal so that said second binary pulse signal is coupled to said signal path in said IC within a first period of said periodic sequence of binary pulses received at said first input terminal after said initial mode of operation ends when said initial mode of operation is followed by said second mode of operation.

10. The apparatus of claim 9 wherein said means for generating said first control signal comprises a digital delay device responsive to said second control signal and to said second input signal for generating said first control signal at an output of said digital delay device; said first control signal having a first value during said initial mode of operation, and having a second value indicating said first mode of operation in response to detecting a binary pulse received at said second input terminal after said initial mode of operation ends.

11. The apparatus of claim 10 wherein said digital delay device comprises a flip-flop having an output set to said first value in response to said second control signal, said first value being representative of one of two binary values, having a data input coupled to a DC level representative of the other one of said two binary values, and having a clock input coupled to receive said second input signal.

12. The apparatus of claim 11 wherein said initial mode of operation of said IC comprises a reset mode of operation and said second control signal comprises a reset signal.

* * * * *